United States Patent
Sun et al.

(10) Patent No.: US 12,241,912 B2
(45) Date of Patent: Mar. 4, 2025

(54) SOCKETLESS OR FLUSH MOUNT QFN (QUAD FLAT NO LEAD) TEST BOARD, FIXTURE, AND METHOD

(71) Applicant: Raytheon Company, Waltham, MA (US)

(72) Inventors: David Yu Shan Sun, Rancho Palos Verdes, CA (US); Alfredo Rene Lara, Norwalk, CA (US)

(73) Assignee: RAYTHEON COMPANY, Waltham, MA (US)

( * ) Notice: Subject to any disclaimer, the term of this patent is extended or adjusted under 35 U.S.C. 154(b) by 161 days.

(21) Appl. No.: 18/048,558

(22) Filed: Oct. 21, 2022

(65) Prior Publication Data
US 2023/0137253 A1    May 4, 2023

Related U.S. Application Data

(60) Provisional application No. 63/270,841, filed on Oct. 22, 2021.

(51) Int. Cl.
  *G01R 1/04* (2006.01)
  *G01R 31/28* (2006.01)

(52) U.S. Cl.
  CPC ....... *G01R 1/0408* (2013.01); *G01R 31/2891* (2013.01)

(58) Field of Classification Search
  CPC ............................ G01R 1/0408; G01R 31/2891
  See application file for complete search history.

(56) References Cited

U.S. PATENT DOCUMENTS

| 2,879,455 | A |   | 3/1959 | Scal |
| 4,947,111 | A | * | 8/1990 | Higman ................. G01R 1/045 324/755.05 |

(Continued)

FOREIGN PATENT DOCUMENTS

| CN | 16-63330 A | 8/2005 |
| CN | 10-0380642 C | 4/2008 |

(Continued)

OTHER PUBLICATIONS

Klenke, "Solderability Testing Protocols and Component Re-Tinning Methods for the 21$^{st}$ Century;" Proceedings of SMTA International; Sep. 25, 2016; 6 Pages.

(Continued)

*Primary Examiner* — Paresh Patel
(74) *Attorney, Agent, or Firm* — CANTOR COLBURN LLP

(57) ABSTRACT

An apparatus comprises a toggle member, a plurality of pogo pins, and a test board in operable communication with the toggle member. The pogo pins are coupled to the toggle member to move along a first axis when the toggle member moves along the first axis. Each pogo pin includes a plunger that moves within the pogo pin along the first axis. The pogo pins and respective plungers contact a top surface of the DUT when the DUT is coupled to the test board and positioned so that a conductor on its outer surface is aligns to and contacts a conductive region of the test board. Movement of the toggle member along the first axis translates to the plungers, applying a pressure sufficient to the top surface of the DUT to ensure flushmount electrical contact between the conductor of the DUT and the conductive region.

7 Claims, 12 Drawing Sheets

(56) References Cited

U.S. PATENT DOCUMENTS

| | | | |
|---|---|---|---|
| 5,502,397 A * | 3/1996 | Buchanan | G01R 31/31905 |
| | | | 324/762.01 |
| 5,694,049 A | 12/1997 | Singh et al. | |
| 5,829,128 A | 11/1998 | Eldridge et al. | |
| 5,832,601 A | 11/1998 | Eldridge et al. | |
| 5,878,486 A | 3/1999 | Eldridge et al. | |
| 5,897,326 A | 4/1999 | Eldridge et al. | |
| 5,983,493 A | 11/1999 | Eldridge et al. | |
| 6,570,399 B2 | 5/2003 | Veghiayan et al. | |
| 6,816,037 B2 | 11/2004 | Hoffman | |
| 7,768,283 B1 | 8/2010 | Patterson | |
| 8,106,671 B2 | 1/2012 | Patterson | |
| 8,188,760 B2 | 5/2012 | Patterson | |
| 8,302,948 B2 | 11/2012 | Hobson et al. | |
| 8,413,320 B2 | 4/2013 | Hafeli et al. | |
| 8,471,567 B2 | 6/2013 | Clarkson | |
| 8,536,737 B2 | 9/2013 | Azancot et al. | |
| 8,624,750 B2 | 1/2014 | Azancot et al. | |
| 8,770,462 B2 | 7/2014 | Beair et al. | |
| 8,943,662 B2 | 2/2015 | Hafeli et al. | |
| 9,831,572 B2 | 11/2017 | McColloch | |
| 10,901,032 B1 | 1/2021 | Afanador | |
| 11,033,990 B2 | 6/2021 | Martinez et al. | |
| 2007/0247179 A1 | 10/2007 | Kingston et al. | |
| 2008/0061809 A1* | 3/2008 | Lee | G01R 1/06722 |
| | | | 324/755.05 |
| 2009/0121735 A1* | 5/2009 | Vaccani | G01R 31/2808 |
| | | | 324/763.02 |
| 2013/0337666 A1 | 12/2013 | Walczyk et al. | |
| 2015/0168486 A1* | 6/2015 | Isaac | G01R 31/2822 |
| | | | 324/756.02 |
| 2017/0102409 A1* | 4/2017 | Sarhad | G01R 31/31905 |
| 2019/0310314 A1* | 10/2019 | Liu | H01Q 1/2283 |

FOREIGN PATENT DOCUMENTS

| | | |
|---|---|---|
| CN | 10-6500444 A | 3/2017 |
| CN | 10-7425331 A | 12/2017 |
| CN | 20-8677760 U | 4/2019 |
| JP | H 08-273776 A | 10/1996 |
| JP | 2000-028680 A | 1/2000 |
| JP | 2001-013207 A | 1/2001 |
| JP | 2001-523985 A | 11/2001 |
| JP | 2001-527206 A | 12/2001 |
| JP | 2005-243511 A | 9/2005 |
| JP | 2011-501633 A | 1/2011 |
| JP | 5471144 B2 | 4/2014 |
| KR | 10-0278093 B1 | 1/2001 |
| KR | 2005-0033664 A | 4/2005 |
| KR | 2005-0099553 A | 10/2005 |
| TW | 200306471 A | 11/2003 |
| TW | 201021331 A | 6/2010 |
| WO | WO 96/15459 | 5/1996 |
| WO | WO 2021/079277 A1 | 4/2021 |

OTHER PUBLICATIONS

Tintronics, "Hot Solder Dip of a QFN Chip for the Military Industry;" Specifications about the QFN Chip for the Military; Retrieved from https://www.tintronics.com/portfolio/hot-solder-dip-of-a-qfn-chip/ on Oct. 19, 2022; 2 Pages.

* cited by examiner

SOCKETLESS OR FLUSH MOUNT QFN (QUAD FLAT NO LEAD) TEST BOARD, FIXTURE, AND METHOD

CROSS REFERENCE TO RELATED APPLICATION

The present application claims the benefit of U.S. Provisional Patent Application No. 63/270,841, entitled "SOCKETLESS OR FLUSH-MOUNT QFN (QUAD FLAT NO LEAD) TEST BOARD, FIXTURE AND METHOD" and filed on Oct. 22, 2021, the entirety of which are hereby incorporated by reference.

STATEMENT REGARDING FEDERALLY SPONSORED RESEARCH

The Government may have certain rights in the invention pursuant to contract number 601523975 NCOS.

FIELD

Embodiments of the disclosure generally relate to devices, systems, and methods for testing integrated circuits (IC's). More particularly, the disclosure describes embodiments relating to devices, systems, and methods for socketless or flush mount testing of integrated circuits such as quad flatpack no lead (RF QFN) devices.

BACKGROUND

An integrated circuit (IC) device may comprise many miniaturized active and/or passive circuits implemented in a semiconductor substrate. IC devices can be provided in various types of packages to enable handling of IC chips during manufacture and assembly of the chip to a circuit board. Various types of packages are known in the art. For example, a quad flat package (QFP) is a surface-mounted integrated circuit package with "gull wing" leads extending from each of the four sides. Another type of package is a QFN (quad flatpack no lead) package. The QFN package is similar to the quad flat package, but the leads do not extend out from the package sides; instead, in a QFN, the four sides of a QFN have electrode contacts. Because there are no leads, QFN packages require a smaller mounting area than QFPs and the height is lower, which can provide advantages in creating more compact circuits and creating compact circuit card assemblies (CCAs) having a higher functionality per area/weight. Increasing functionality per area/weight provides operational and functional advantages in many applications, including but not limited to spacecraft and avionics applications. Moreover, as those of skill in the art will appreciate, reducing the size and weight of circuits and CCAs often can provide an inherent cost savings.

IC devices like QFN often are tested before assembly into a circuit, to ensure proper operation before they are used. For example, it can be useful to test the basic direct current (DC) and radio frequency (RF) electrical connections between the test board and the IC or device under test (DUT) in order to identify poor connections and defective active and/or passive circuitry within a QFN. One type of testing of devices such as packaged IC devices (e.g., QFNs), involves making connections between the leads or terminals of the packaged device and a test fixture. The test fixture is configured to operate or exercise the device via the temporary connection(s), to help ensure proper device operations. An exemplary test fixture can include a set of switches configured to connect to a set of test signals, power signals, and/or ground traces. During operation, an automated process controls the signals sent to or received from the device, to check for proper operation.

SUMMARY

The following presents a simplified summary in order to provide a basic understanding of one or more aspects of the embodiments described herein. This summary is not an extensive overview of all of the possible embodiments and is neither intended to identify key or critical elements of the embodiments, nor to delineate the scope thereof. Rather, the primary purpose of the summary is to present some concepts of the embodiments described herein in a simplified form as a prelude to the more detailed description that is presented later.

An apparatus is provided, comprising a toggle member, a plurality of pogo pins, and a test board. The toggle member is configured for movement along a first axis. The plurality of pogo pins are fixedly coupled to the toggle member in a predetermined orientation, wherein the plurality of pogo pins are configured for movement along the first axis when the toggle member is moved, wherein each respective pogo pin includes a plunger configured to move within the pogo pin along the first axis. The test board is in operable communication with the toggle member, the test board configured to have a first region, for receiving a device under test (DUT), the test board having formed thereon within the first region at least one conductive region configured to substantially align with a corresponding conductor disposed on an outer surface of the DUT. An arrangement of the plurality of pogo pins and respective plungers is configured to make contact with a top surface of the DUT when the DUT is positioned to be aligned to and disposed on the first region of the test board. The apparatus is configured so that movement of the toggle member along a first axis translates to at least a portion of the plurality of plungers applying a pressure sufficient to the top surface of the DUT to ensure a flushmount electrical contact between the corresponding conductor of the DUT and the conductive region of the test board.

In some embodiments, the plurality of plungers is configured to apply a distributed pressure. In some embodiments, the top surface of the DUT has at least a first region that is supported underneath the top surface and a second region that is not supported under the top surface, and wherein the arrangement of pogo pins is configured to apply the pressure to the top surface of the DUT only within the first region that is supported. In some embodiments, the arrangement of the pogo pins and plungers is configured to compensate for at least a portion of variations in coplanarity in at least one of the test board and the DUT. In some embodiments, the toggle member further comprises a first mounting point configured to control a distance of travel that the plurality of pogo pins can travel along the first axis.

In some embodiments, the pressure is selected to minimize damage to the top surface of the DUT. In some embodiments, the DUT comprises a quad flatpack no lead (QFN) device. In some embodiments, the flushmount electrical contact is configured to minimize one or more parasitics in the apparatus. In some embodiments, each respective pogo pin further comprises a respective contact tip configured to distribute pressure and minimize damage to the top surface of the DUT when the toggle member is moved.

In another aspect a method of providing a testing apparatus for testing an integrated circuit is provided. A test fixture is provided, the test fixture comprising a toggle member configured for movement along a first axis. A plurality of pogo pins is fixedly coupled to the toggle member in a predetermined orientation, wherein the plurality of pogo pins are configured for movement along the first axis when the toggle member is moved, wherein each respective pogo pin includes a plunger configured to move within the pogo pin along the first axis. A test board is provided, the test board in operable communication with the toggle member, the test board configured to have a first region for receiving a device under test (DUT), the test board having formed thereon within the first region at least one conductive region configured to substantially align with a corresponding conductor disposed on an outer surface of a device under test. An arrangement of the plurality of pogo pins and respective plungers is configured to make contact with a top surface of the DUT when the DUT is positioned to be aligned to and disposed on the first region of the test board. The apparatus is configured so that movement of the toggle member along a first axis translates to at least a portion of the plurality of plungers applying a pressure sufficient to the top surface of the DUT to ensure a flushmount electrical contact between the corresponding conductor of the DUT and the conductive region of the test board.

In some embodiments, the apparatus is configured for applying an electrical signal to the conductive region of the test board when the DUT is in flushmount electrical contact with the test board, wherein the flushmount electrical contact is configured to enable the electrical signal to travel from the conductive region of the test board to the corresponding conductor of the DUT. In some embodiments, the method further comprises configuring the plurality of plungers to apply a distributed pressure. In some embodiments, the top surface of the DUT has at least a first region that is supported underneath the top surface and a second region that is not supported under the top surface, and wherein the arrangement of pogo pins is configured to apply the pressure to the top surface of the DUT only within the first region that is supported.

In some embodiments, the method further comprises configuring the arrangement of the pogo pins and plungers to compensate for at least a portion of variations in coplanarity in at least one of the test board and the DUT. In some embodiments, the method further comprises selecting a pressure that minimizes damage to a top surface of the DUT. In some embodiments, the DUT comprises a quad flatpack no lead (QFN) device. In some embodiments, the method further comprises configuring the flushmount electrical contact to minimize one or more parasitics in the apparatus. In some embodiments, the method further comprises providing for each respective pogo pin a respective contact tip configured to distribute pressure and minimize damage to the top surface of the DUT when the toggle member is moved.

In some embodiments, the method further comprises providing an integrated circuit (IC), the IC having a first surface with a plurality of conductors disposed thereon, wherein the first surface has a first coplanarity, performing a hot solder dip (HSD) process on the IC to coat the plurality of conductors with a first thickness of solder coating, to create a dipped IC, burnishing the first thickness of solder coating to a second coplanarity, wherein the second coplanarity is more planar than the first coplanarity, to create a dipped burnished IC, and configuring the dipped burnished IC as the DUT within the test fixture.

In some embodiments, the method further comprises disposing the DUT adjacent to the first region of the test board, applying a force to the toggle member sufficient to ensure that the DUT is in flushmount electrical contact with the test board, and applying an electrical signal to the conductive region of the test board, wherein the flushmount electrical contact is configured to enable the electrical signal to travel from the conductive region of the test board to the corresponding conductor of the DUT, wherein the electrical signal is configured to test the DUT.

In further embodiments, the method further comprises removing the applied electrical signal, and changing the applied force on the toggle member, wherein the changed force is configured to cause the plungers to relieve the pressure applied to the top surface of the DUT to enable the DUT to be removed from the test fixture.

In a further aspect, a means for testing an integrated circuit (IC) is provided, the means for testing the IC comprising means for moving a toggle member configured for movement along a first axis, means for translating a force applied to the first toggle member into a controlled distributed force traveling along the first axis and applied to a top surface of a device under test (DUT), means for supporting a DUT under test when the means for translating is applying the controlled distributed force, means for providing an electrical signal to the DUT when the DUT is supported by the means for supporting, and means for configuring a flushmount contact between a conductor of the DUT and the means for providing an electrical signal.

In some embodiments, the means for testing an IC further comprises means for compensating for at least a portion of variations in coplanarity of the DUT. In some embodiments, the means for testing an IC further comprises means for controlling a distance of travel of the means for translating a force. In some embodiments, the means for testing an IC further comprises means for distributing pressure and minimizing damage to a top surface of the DUT.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the claims included herein.

Details relating to these and other embodiments are described more fully herein.

BRIEF DESCRIPTION OF THE DRAWINGS

The advantages and aspects of the described embodiments, as well as the embodiments themselves, will be more fully understood in conjunction with the following detailed description and accompanying drawings, in which.

The drawings are not to scale, emphasis instead being on illustrating the principles and features of the disclosed embodiments. In addition, in the drawings, like reference numbers indicate like elements.

DETAILED DESCRIPTION

Figure 1:
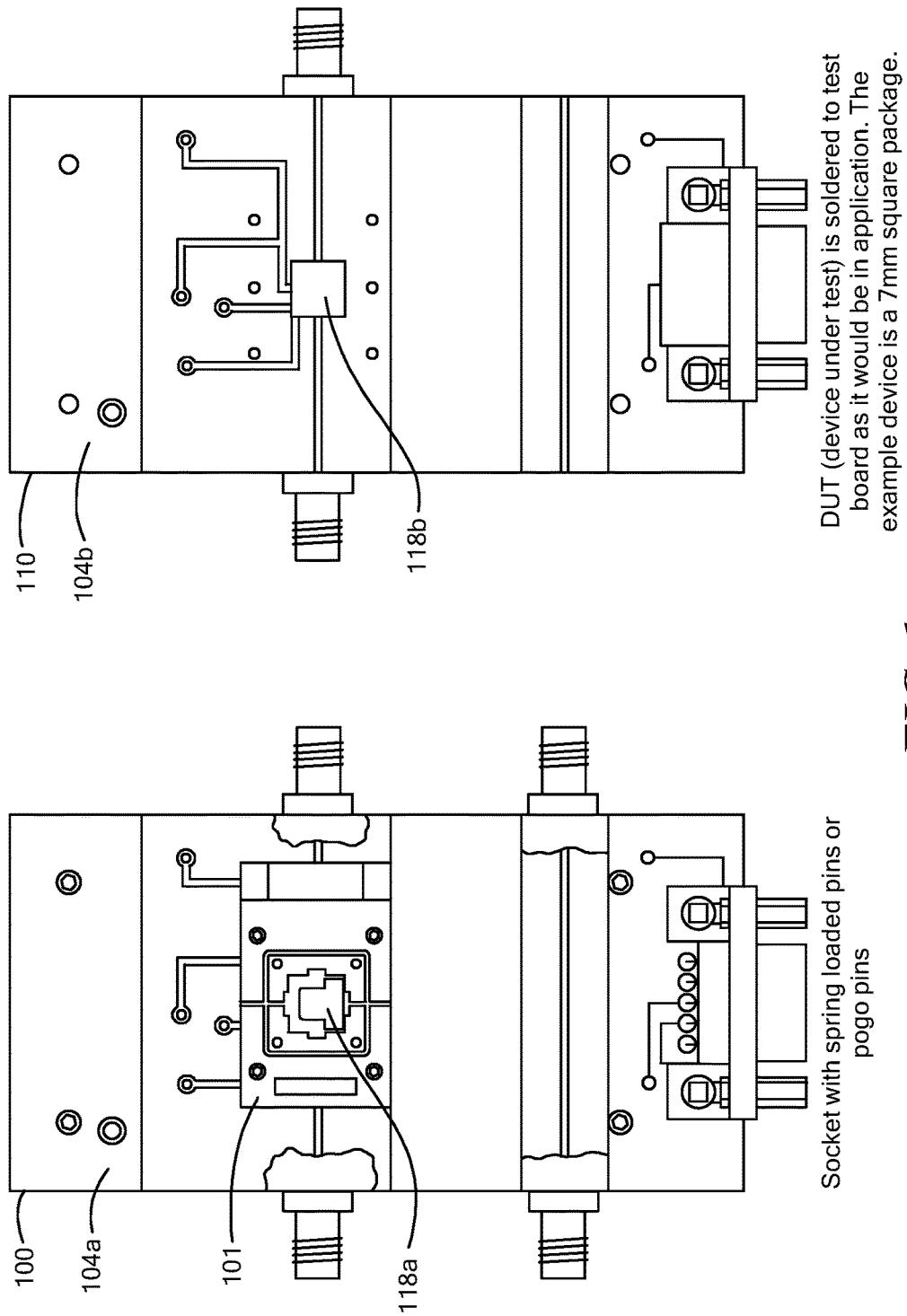
FIG. 1 is an illustration depicting exemplary non-destructive and destructive test fixtures for quad flatpack no-lead (QFN) devices, in accordance with one embodiment.

Before describing in detail the particular improved systems, devices, and methods, it should be observed that the concepts disclosed herein include, but are not limited to, one or more novel processes, one or more novel structural combination of components and circuits, and one or more novel systems, and are not necessarily limited solely to the particular detailed configurations thereof. Accordingly, the structure, methods, functions, control and arrangement of process steps, elements, components and/or circuits have, for the most part, been illustrated in the drawings by readily understandable and simplified block representations and schematic diagrams, in order not to obscure the disclosure with structural details which will be readily apparent to those skilled in the art having the benefit of the description herein. In particular, it should be noted that figures herein are not necessarily drawn to scale, even when dimensions are shown, so that particular details and features may be more clearly illustrated and described.

In addition, QFN packages also can be known by other names in the art, including but not limited to: MLF (micro lead frame); MLPD (micro-lead frame package dual); MLPM (micro lead frame package micro); MLPQ (micro-lead frame package quad); VQFN (very thin quad flat no-lead); and DFN (dual flat no-lead), and the embodiments herein, although described in connection specifically with QFN devices, should be understood to be equally applicable to all of these packages as well as any IC packages known in the art. they are using different names.

Test fixtures for testing integrated circuits (ICs) can implement various connection techniques for connection of a device, such as a quad flatpack no-lead (QFN) device, to a test board. Typically, QFN package parts are tested in custom (design and procured) sockets that are configured based on various manufacturers of the QFN packages. FIG. 1 is an illustration depicting an exemplary non-destructive test fixture 100 and an exemplary destructive test fixture 110, usable with QFN devices 118, in accordance with one embodiment. One connection method, shown in the image 100, sometimes referred to as "nondestructive test" involves using a temporary connection of the IC device 118a to the test fixture or test board 104a, using a socket 101 that does not require bonding the leads/terminals of the package 118a to the test fixture 104a. With the nondestructive test using a socket 101, the IC device 118a can be re-used after test is complete. An exemplary socket 101 can include a source of compression to hold the IC package 118a in place, so that the conductive leads/pins at the bottom can make electrical contact with a plurality of spring-loaded pins or so-called "pogo pins," which are made from conductive material and which are configured to make contact with corresponding conductors or trace son the test board 204.

Figure 2:
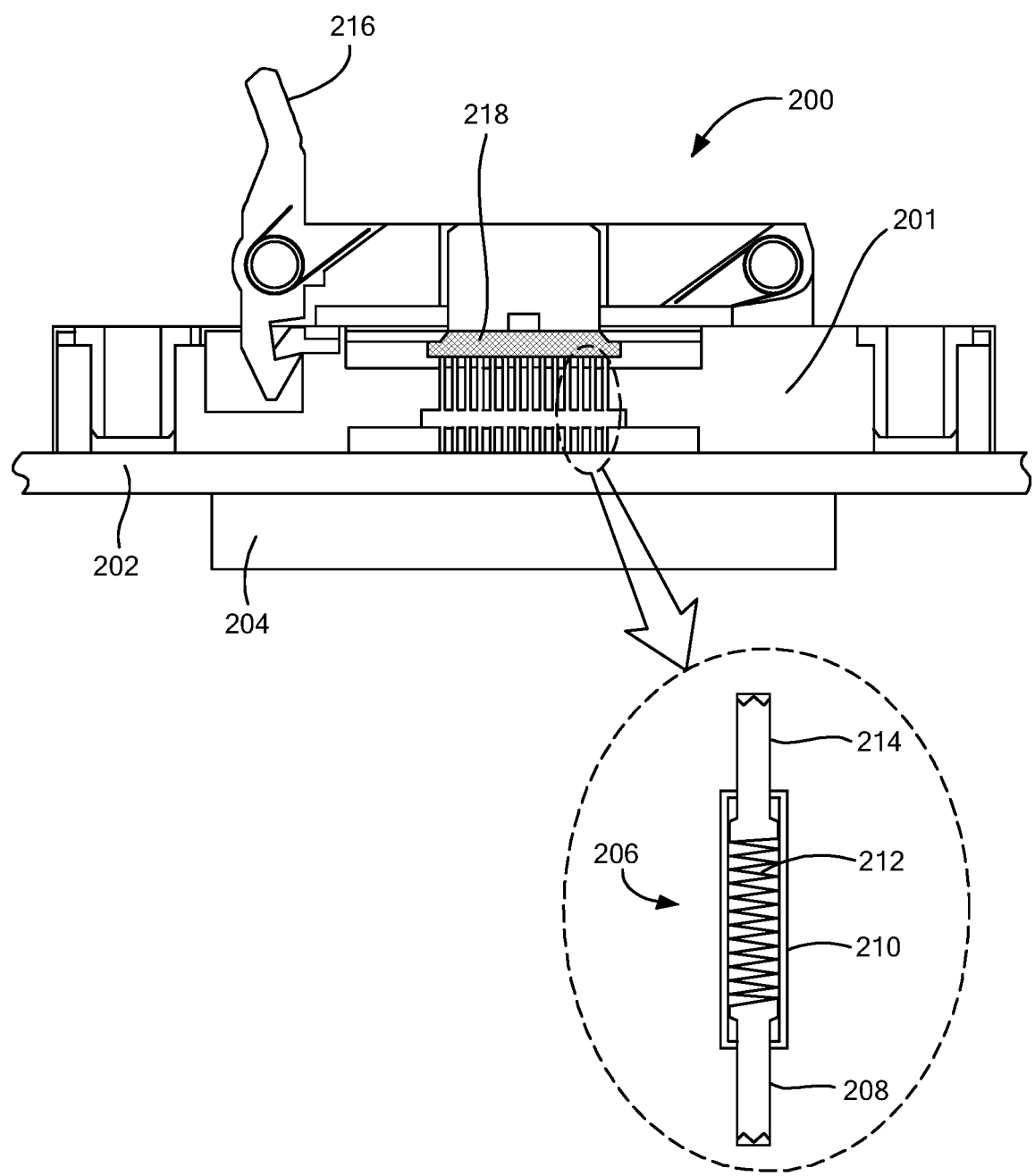
FIG. 2 is a cross-sectional illustration of a non-destructive socketed test fixture, in accordance with one embodiment.

FIG. 2 is a cross-sectional illustration of a non-destructive socketed test fixture 200, in accordance with one embodiment. Referring briefly to FIG. 2, the socket 201 includes a lever 216 that helps to apply compressive force to the top of the package 218, to push the package 218 down onto the pogo pins 206. The test socket 201 is configured in an arrangement to apply pressure over the entire top surface of the package 218. The pogo pins 206, which can be arrayed like a so-called "bed of nails" test fixtures, so that the pogo pins 206 can make electrical contact between a device under test (DUT) and corresponding conductors/traces (not visible in FIG. 2) on the test board 204, where the conductors/traces are the paths to electrically test the package 218 via one or more applied test signals. Various types of pogo pins can be used, depending on the fixture arrangement.

For example, in FIG. 2, each exemplary pogo pin 206 includes a top plunger 214 and bottom plunger 208, connected via a spring 212 disposed within a barrel 210. As is understood in the art, the pogo pin 206 is configured to help to make a temporary electrical connection between the package 218 and conductive traces/leads on the test board 204. When force is applied to the top plunger 214 of the pogo pin 206, the spring 212 (e.g., a helical spring) is compressed as the top plunger 214 moves inside the barrel 210, to make an electrical connection between the top plunger 214 and the bottom plunger 208. For example, a pogo pin such as that of FIG. 2 can have two paths of current flow: through the plungers 214, 208 and through the walls of the barrel 210, which are all generally made using electrically conductive material. A small portion of the current also goes through the spring 212, but since the spring 212 typically is made using stainless steel (SUS) or tempered high carbon steel (also known as "music wire"), the contact resistance can be rather high. In addition, the shape of the barrel 210 retains the top and bottom plungers 214, 218, preventing the spring 212 from pushing either plunger out when the pin is not locked in place.

Use of sockets, especially at higher frequencies such as radiofrequency (RF) can present issues affecting the accuracy of the test results. For example, if QFN packages are used for an RF part such as a monolithic microwave integrated circuit (MMIC), the interconnect or conductive path in the test socket to interface between the QFN package part and the test board of the test fixture, can induce or add parasitic s.

Parasitics, as is known in the art, refers to unwanted intrinsic electrical elements that are created on places like circuit boards by virtue of their proximity to actual circuit elements. These intrinsic electrical elements may exist along or between any conductive elements (e.g., along traces or between adjacent component pins). The behavior or such parasitics can contribute to non-ideal electrical behavior of actual circuit elements. Parasitics can take various forms, including resistive, inductive, and capacitive, as well as ground loops, RF reflections, etc. For example, parasitic inductance can arise along a wire or trace and can store and dissipate electrical energy in a manner similar to an actual inductor. Parasitic capacitance can arise when two nearby conductive elements are at or possess different charge levels. Parasitic resistance can arise in series along traces or as a shunt between conductive elements.

Parasitics can contribute to losses in radio frequency (RF) performance of the device under test (DUT). Parasitics do not present the same issue for digital or power device QFNs, which generally operate at lower frequencies. In addition, test fixtures add parasitics to the characterization scheme such as ground loops and RF reflections at the interfaces.

Parasitic inductance is often taken as an afterthought in high-speed design, power electronics, and even multi-board power systems or systems with high-strength wireless capabilities. Any structure of semiconducting or conducting material on a printed circuit board (PCB) will have some parasitic inductance, leading to problems like crosstalk, induced currents due to EMI, noise coupling, and other effects that degrade signal quality.

Unfortunately, parasitic capacitance and inductance in a PCB is sometimes unavoidable. As is known, a PCB is composed of a number of parallel conducting elements that are separated by an insulator, basically forming a capacitor. Likewise, conductors on a PCB will inevitably form complete loops, creating an equivalent inductor. Measuring the parasitic inductance and capacitance in a PCB can be extremely difficult. However, it can be calculated directly from first principles. Generally, the parasitic inductance in various places in a given printed circuit board is on the order of nH, while parasitic capacitance reaches on the order of pF. Very large boards with longer and/or wider traces can have much higher parasitic capacitance and inductance.

With lower speed digital, lower frequency analog, or purely direct current (DC) circuit boards, parasitics are often ignored because they do not have an appreciable impact on the functionality of these devices. However, designers of PCBs that operate at high frequency, high data rates, and/or using mixed signals, should take account of parasitic s, such as parasitic capacitance and inductance, during the layout phase.

For example, every pad that appears in a board adds its own parasitic capacitance, and every trace adds its own parasitic inductance. Pads also add their own parasitic resistance that can incur IR losses, although this can be minimized with proper soldering. When working with any components that switch quickly, especially switching power supplies, the momentary burst of current from the switching component and the propagating signal along a trace will induce a voltage spike in a nearby trace. A trace with a larger parasitic inductance will experience a larger induced voltage spike. This generally increases bit error rates in digital systems, although in power electronics, this can cause involuntary switching in nearby logic circuits. Parasitic capacitance in power electronics can also slow the switching time in high-speed field effect transistors (FETs), increasing switching losses. While this mildly reduces the induced voltage spike in downstream components, the strong magnetic fields generated during switching can still cause involuntary switching.

In analog circuits, stray currents induced by high frequency analog signals can interfere with the operation of other analog components, or with the analog portion of a mixed signal component. The analog signal from one trace/component can induce a low-level oscillation in another trace/component when the parasitic inductance is as low as 1 nH. Parasitic capacitance also leads to crosstalk, and even low levels of parasitic capacitance can affect the gain of amplifier circuits.

Unfortunately, in real world circuits, it is not possible to completely eliminate parasitics. However, there are some simple layout choices that can be made to help reduce problems from parasitics. Selecting the right components can also prevent signal problems that arise from parasitic capacitance and inductance. Reducing parasitic inductance requires making the equivalent loop area covered by traces as small as possible. An advantageous way to do this is to place the ground plane for critical traces directly above the layer containing the ground plane. In a 4-layer board, one can place the power plane on the bottom layer and route some sensitive traces between the power and ground planes. This will prevent EMI from signals in one layer from inducing noise in signals in another layer.

Referring again to FIGS. 1 and 2, FIGS. 1 and 2 help to illustrate why there would be parasitic (primarily) inductance parasitic losses associated with the socketed testing configuration for devices such as QFNs, with such losses possibly attributed to the pogo pins 206 and also possibly to routing circuitry in the test board that would be different from application. Thus. for RF QFNs tested in known types of sockets, the tested RF performance might not truly reflect the RF performance once the part is actually soldered directly to a printed wiring board (PWB).

Figure 3:
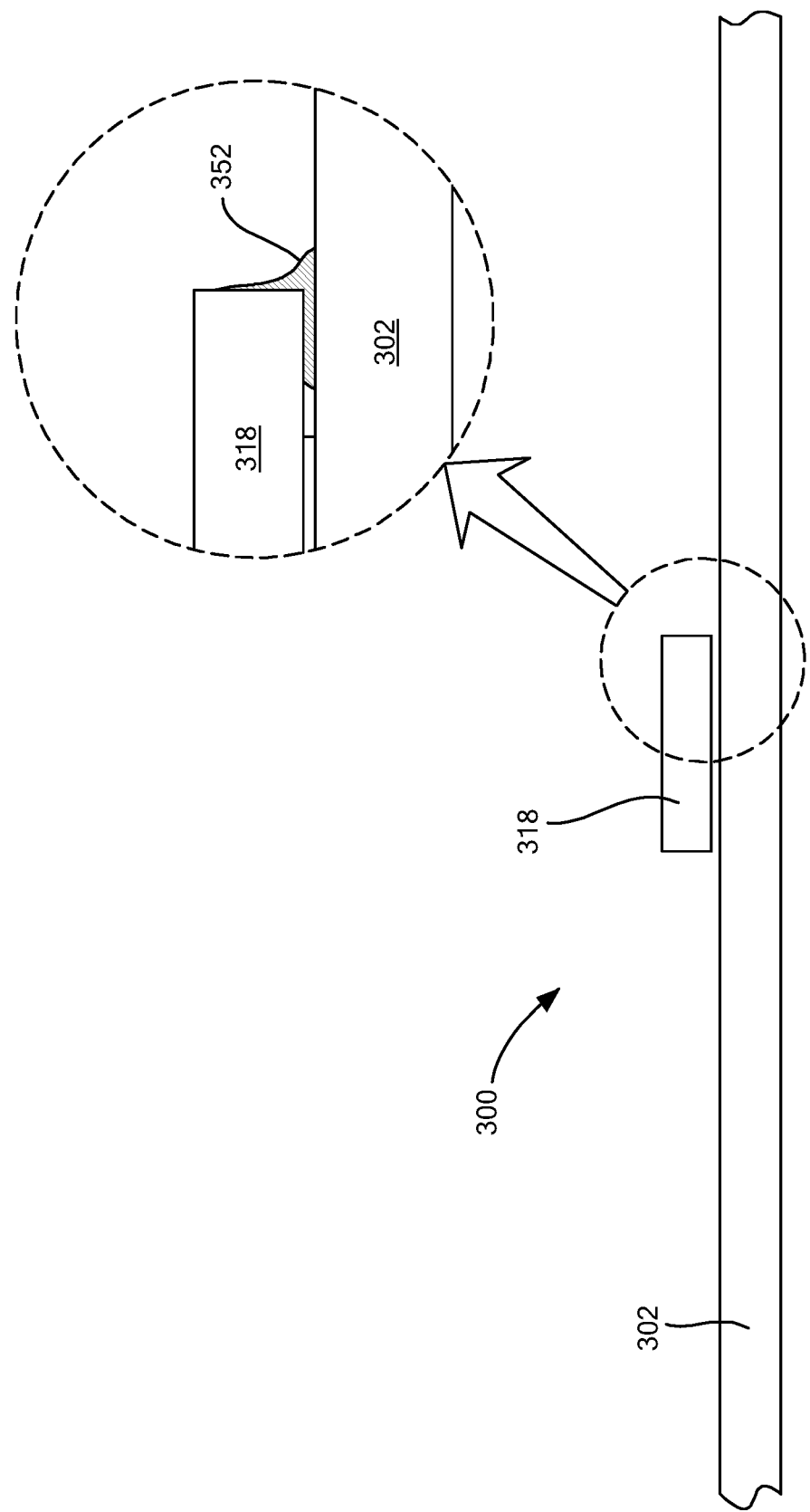
FIG. 3 is a cross-sectional illustration of a destructive/non-reuse solder down text fixture, in accordance with one embodiment.

Another known option for testing, direct solder of a component to a test board, generally does not present the same type of parasitic issue. Soldering the IC device directly to a test board used in the fixture is shown in the illustration 110 of FIG. 1. This method is sometimes referred to as a "destructive" test method because the IC device tested in this manner, generally is not able to be re-used in any high-reliability applications per industry protocol for space programs and/or military electronics, even if it is desoldered or otherwise removed from the test fixture. FIG. 3 is a cross-sectional illustration 300 of a destructive/non-reuse solder down text fixture, similar to the illustration 110 of FIG. 1, in accordance with one embodiment. Referring briefly to FIG. 3, the package 318 is attached directly to corresponding conductive traces/pads (not shown) on the test board 302, via solder 352.

Although soldering parts directly to a test board can help to remove the need to calibrate or correlate out the parasitics, there are many applications (e.g., high reliability electronic assemblies such as Class A space program applications) where reuse of soldered parts is expressly prohibited. In addition, removal of soldered devices also can increase the chance of damaging the soldered device. Hence, re-use of components tested and/or functionally screened using the "solder" types of test fixture, is not an acceptable solution for all applications.

Figure 4:
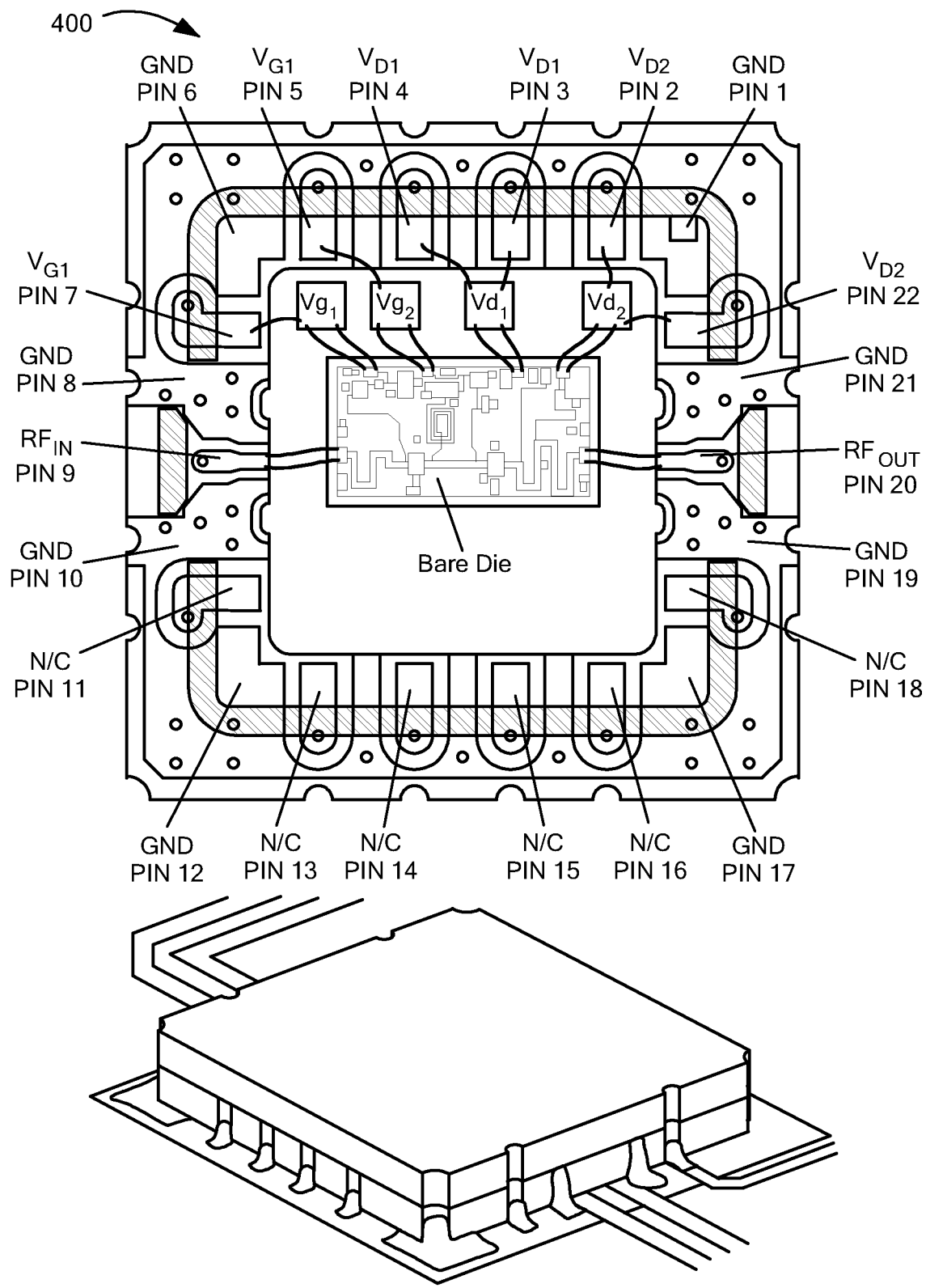
FIG. 4 is an exemplary illustration of devices used as part of a correlation study comparing socketed test fixtures versus solder down test fixtures.
Figure 5:
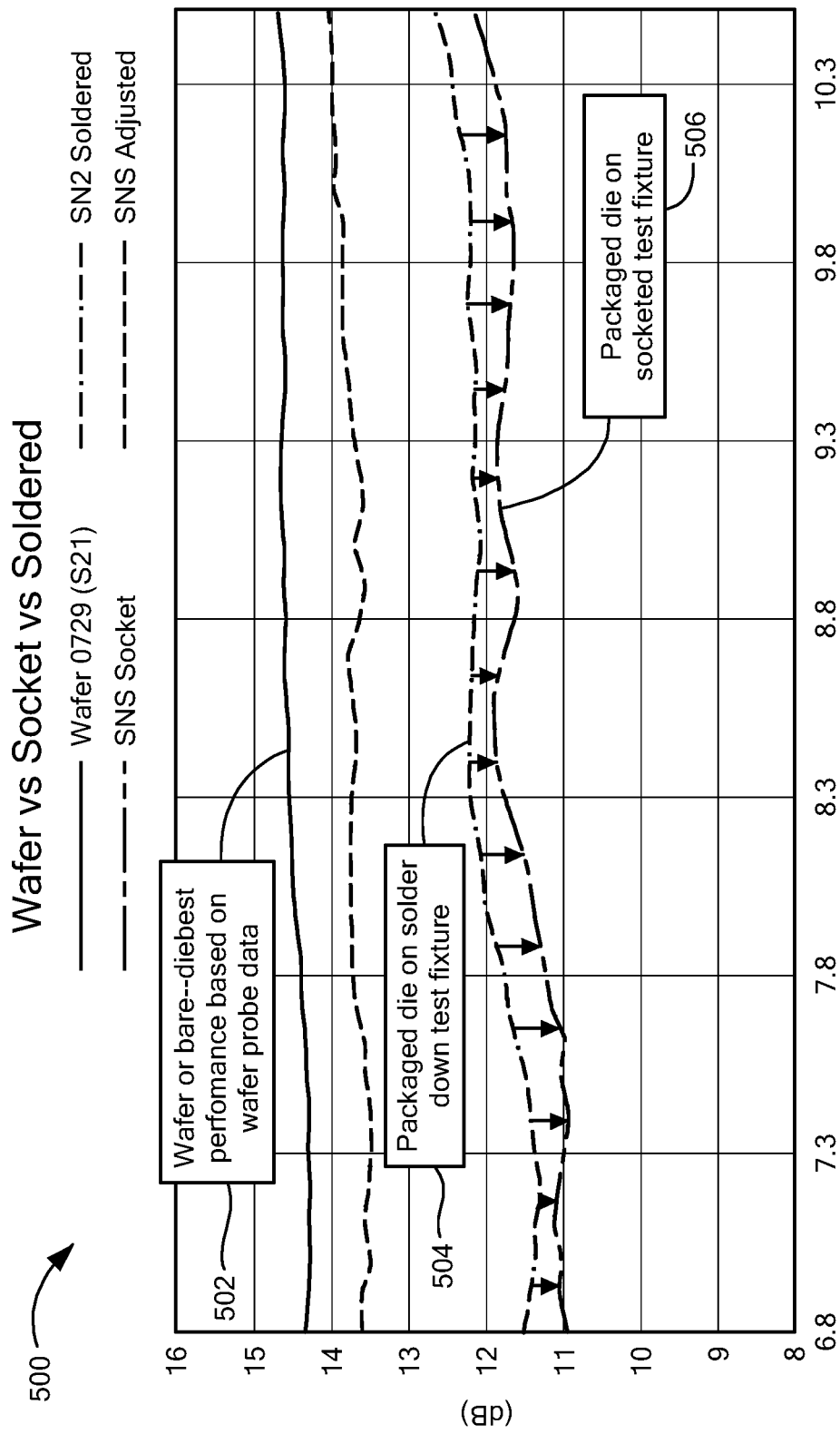
FIG. 5 is a chart comparing performance of socket vs soldered vs wafer, in accordance with one embodiment.

One way to compensate for parasitics that can arise from test fixtures is to try to calibrate the fixtures to account for any losses or parasitic effects. Another way is by correlation testing between the DUT tested in socketed test fixture/board and then the very same DUT in a solder down test fixture/board. Then after data analysis, measured RF performance data with losses attributed to sockets are de embedded to understand the true performance of the tested parts in the soldered down configuration or flight/application configuration. For example, FIG. 4 is an exemplary illustration 400 of devices used as part of a correlation study comparing socketed test fixtures versus solder down test fixtures, and FIG. 5 is a chart 500 comparing performance of socket vs soldered vs wafer alone, in accordance with one embodiment.

In the chart 500, the y-axis shows signal strength (dB) as a function of frequency (x-axis). The chart 500 shows that wafer or bare die data 502 provides the best performance based on wafer probe data. The next best data is the packaged die on solder down text fixture data 504. The worst data is the packaged die on socketed test fixture data 506. As FIG. 5 shows and as FIG. 4 explains, the correlation study of samples reveals a consistent parasitic loss of approximately 0.5 dB across all frequencies (as shown by the arrows on the graph 500). These losses can be attributed to the socketed test fixture vs. the solder down test fixture.

At least some embodiments herein attempt to resolve at least some of these concerns with both socketed and soldered testing configurations, while minimizing the need to have to perform as much calibration and/or correlation testing. At least some embodiments herein attempt to improve testing of devices such as QFN devices while also minimizing damage to such devices that can arise during or as a result of testing.

In one embodiment, a configuration is provided wherein a QFN (or any other device under test (DUT) is temporarily flush-mounted onto a RF test board via pressure contacts, where the pressure contacts are applied in a non-damaging way (e.g., around the lead frame of a QFN), and wherein the best possible flush mount contact is achieved through a process of solder dipping or coating the QFN contacts, and then smoothing the solder dip coating to achieve a high degree of coplanarity to help ensure a direct flush mount contact. This configuration and technique (described further herein) provides the non-destructive advantages of a socketed test fixture while emulating the direct contact and low losses that a soldered test fixture provides. Embodiments implemented as described herein help to reduce and/or eliminate parasitics losses that would be present in a socket test fixture/board. The application of pressure, as described herein, helps to assure good metal to metal (conductor to conductor) contact among the pads of the DUT directly to the test board. Thus, the tested performance without the socket can closely match the in-application performance— similar to the soldered down performance but without the solder.

Figure 6:
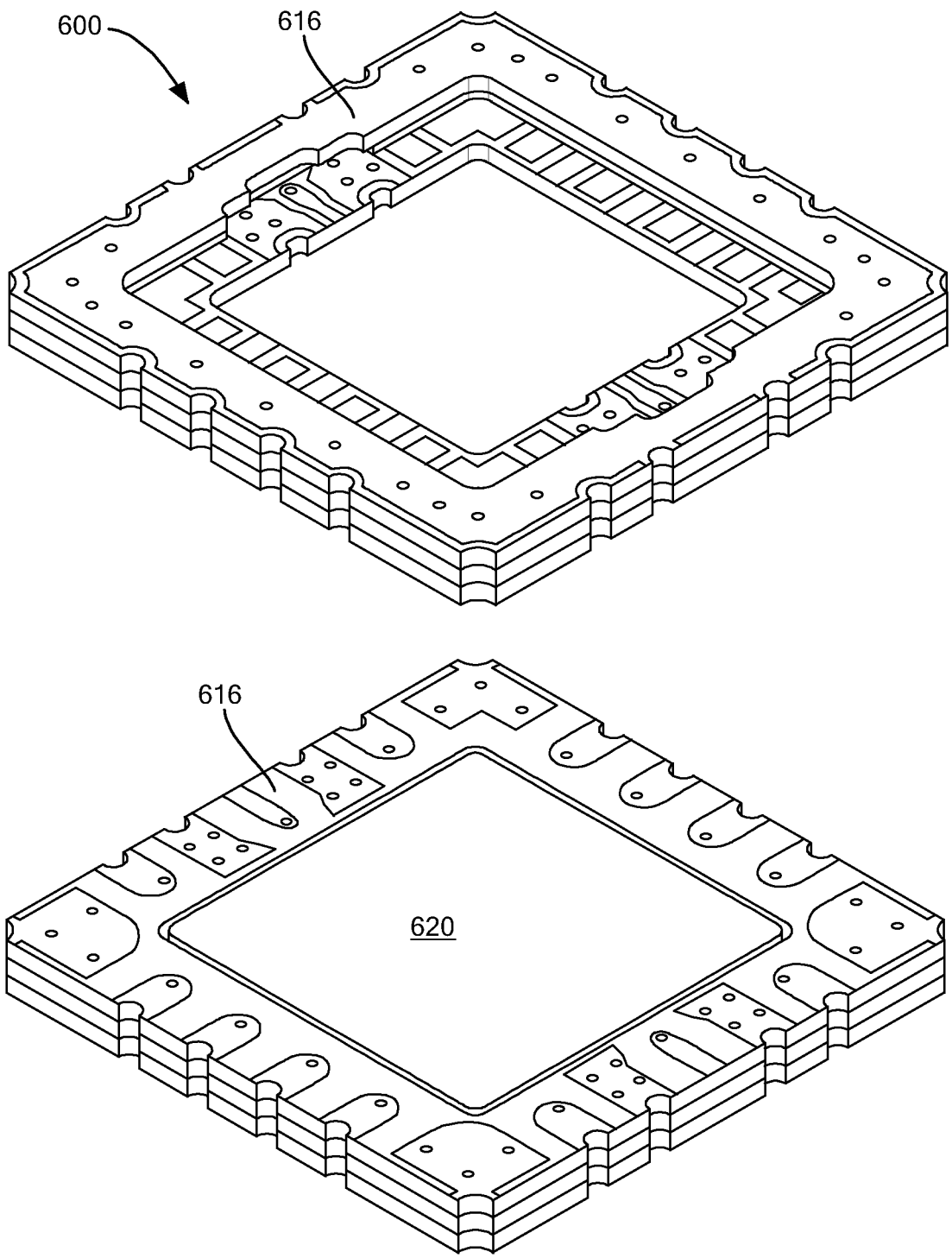
FIG. 6 is an exemplary stack-up and manufacturing description of an RF QFN usable for at least some embodiments herein.
Figure 7A:
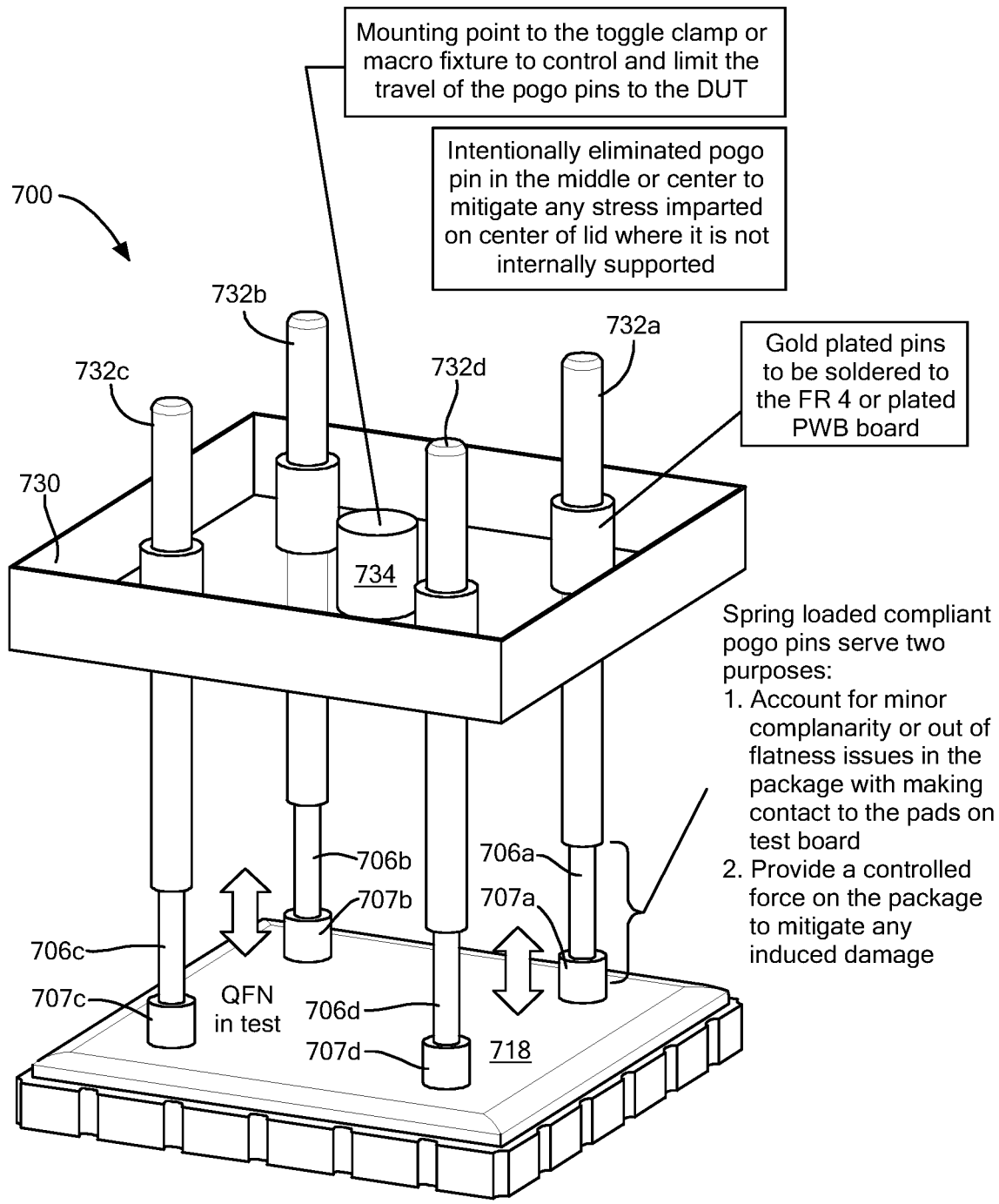
FIGS. 7A-7B is an exemplary perspective view (7A) and illustration of fixture connections (7B) for an exemplary test fixture in accordance with one embodiment herein.
Figure 7B:
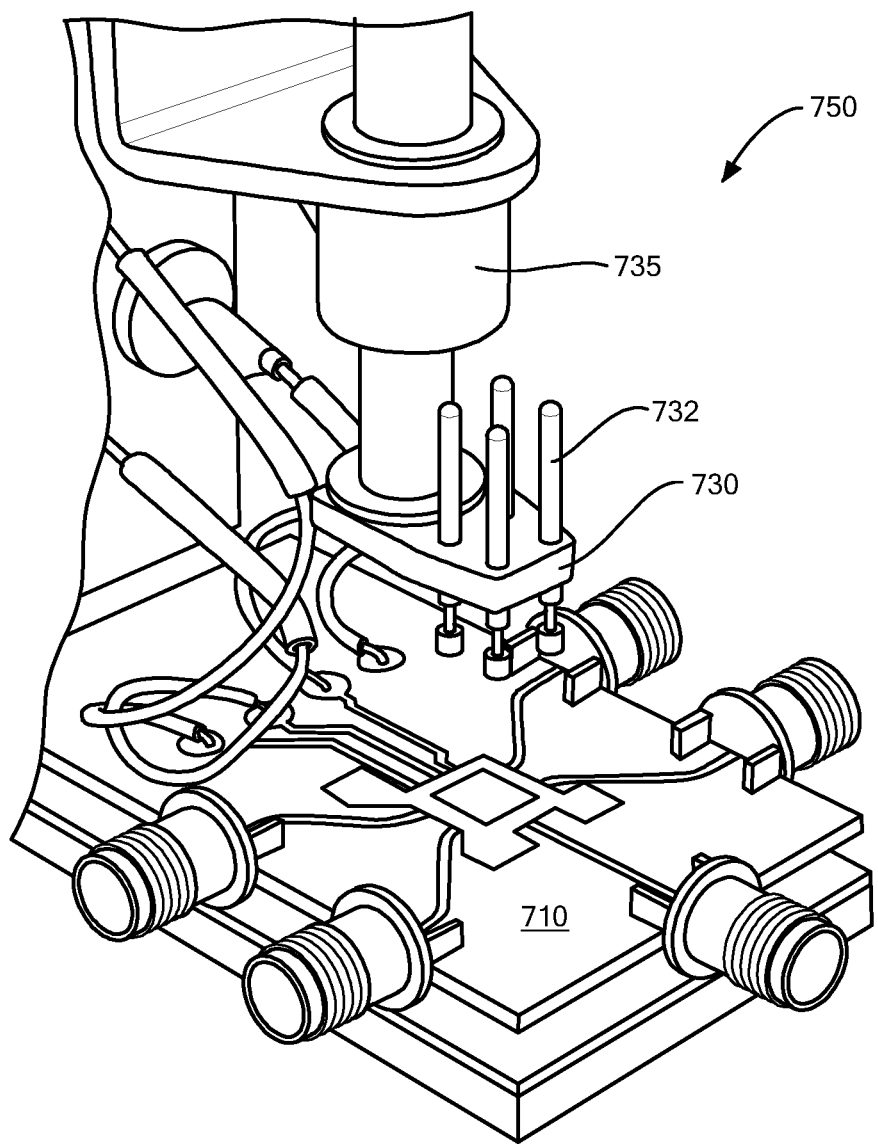

FIG. 6 is an exemplary stack-up and manufacturing description 600 of an RF QFN usable for at least some embodiments herein, and FIGS. 7A-7B is an exemplary perspective view 700 (7A) and illustration 750 of fixture connections (7B) for an exemplary test fixture in accordance with one embodiment herein. As the embodiment of FIGS. 7A-7B show, the exemplary test fixture 700 includes a plurality of gold-plated pogo pins 732a-732d that have barrel portions that are soldered to a toggle clamp member 730. The respective pogo pins 732a-732d also have respective projecting plungers 706a-706d, and, advantageously, at the end of each respective plunger 706a-706d is a respective contact tip 707a-707d, wherein the contact tip 707a-707d of each pogo pin 732a-732d is configured to be able to apply the force applied via movement of the toggle member 730, to apply a controlled spring-loaded force at each pin 732, thereby distributing the pressure. Advantageously, the contact tip 707a-707d has a size and shape that is able to apply the force without damaging the top surface of the QFN 718. For example, it can be preferable, in certain embodiments, that the contact tip 707a-707d be substantially planar and not pointed or curved. It will be understood that the size and shape of the contact tips 707a-707d shown in FIG. 7 (and also in FIG. 12) is exemplary and not limiting. Many other configurations are possible. For example, a more flat and planar contact tip may be used to distribute a downward force more equally.

In the arrangement of FIGS. 7A, 7B, any pattern of pogo pins 732 is usable, but advantageously, in certain embodiments, the pogo pins 732 are positioned to apply the force to portion the top surface of the QFN 718 that lies above or near the lead frame of the QFN (not visible in FIG. 7A, but shown, e.g., in view 1 of FIG. 6., as the lead frame 616 that forms a perimeter around the die 620).

Referring to FIGS. 7A-7B, in an exemplary embodiment, the toggle clamp member 730 is made using plated printed wiring board (PWB), a piece flame retardant glass-reinforced epoxy resin laminate (e.g., FR 4) or other suitably rigid material capable of having the pogo pins 732 attached thereto. The toggle member 730 also includes a mounting point 734 that is configured to attach to an external control system 735 that applies an up and down force at the mounting point 734, to cause the toggle member 730 to have an upward or downward movement, along an axis (e.g., the y-axis) that effectively moves the pogo pins 732 towards and away from the DUT (e.g., the QFN 718). In at least some embodiments, the toggle member 730 is configured to control and limit the distance or amount of travel of the pogo pins 732 to the DUT. Those of skill in the art will appreciate that the external control system 735 can be any entity, apparatus, or even a person, under any type of control (including but not limited to fully automated, semi-automated, manual, etc.) that can cause the toggle member 730 to have an upward or downward motion.

Note that the pogo pins themselves are not being used to make electrical contact with the QFN 718; rather, they are being used to apply a controlled, distributed, spring-loaded pressure force to enable the QFN 718 to have a flush mount electrical contact to a test board 710. This is shown more particularly in FIGS. 11 and 12, described further herein. The spring-loaded, compliant pogo pins 732 advantageously are configured to serve multiple purposes. For example, one purpose is to account for minor coplanarity or out of flatness issues in the package 718 and/or the test board 710, which might interfere with a flush contact between the underside of the package 718 and pads on the test board 710. Another purpose is to help provide a distributed, controlled force on the package 728 to mitigate and/or reduce any induced damage to the hermetically sealed QFN package. One of skill in the art will appreciate that this arrangement also is adaptable to package types other than QFNs, especially any types where a flush contact to conductors/pins that are at least partially disposed on a bottom side, is required, and wherein there is at least a portion of a top side to which the pogo pins 732 can non-destructively apply pressure.

The flush contact between the QFN package 718 and contacts/pads on the test board 710 helps to enable non-destructive test of the QFN 718 without soldering, while helping to reduce parasitics seen with arrangements that use sockets. The arrangement of FIGS. 7A-7B helps to eliminate the routing circuitry, and use of pogo pins for carrying electrical signals, which arise when using a socket (e.g., a custom socket), which contribute to parasitic losses.

In at least some embodiments, the test board 710 used in the arrangement of FIG. 7A-7B, is configured to have thereon a solder pad pattern that substantially matches that of the respective QFN parts. For example, the pad pattern on the test board can have the same pattern as that used on the ultimate circuit card assembly (CCA) to which the QFN is to be attached. This minimizes a need for custom designed socket. In addition, this can eliminate a need to have to have a test board adjust for a "pin out" of a test socket. Further, use of the configuration of FIGS. 7A-7B helps to minimize or eliminate a need to de-embed parasitic losses associated with test sockets. Another advantage is that this arrangement enhances the ability to mix and match components in the RF chain (chain of testing of RF devices) to optimize test performance. Thus, the arrangement of FIGS. 7A-7B allows for non-destructive testing and characterization of devices, such as QFNs, without a need to solder the devices.

In another embodiment, the flush mount contact between the novel test fixture and the QFN is further improved by novel process configured to improve the coplanarity of the bottom side of the QFN, to better achieve a flushmount contact. This is described further below in connection with FIGS. 8-13.

Figure 8:
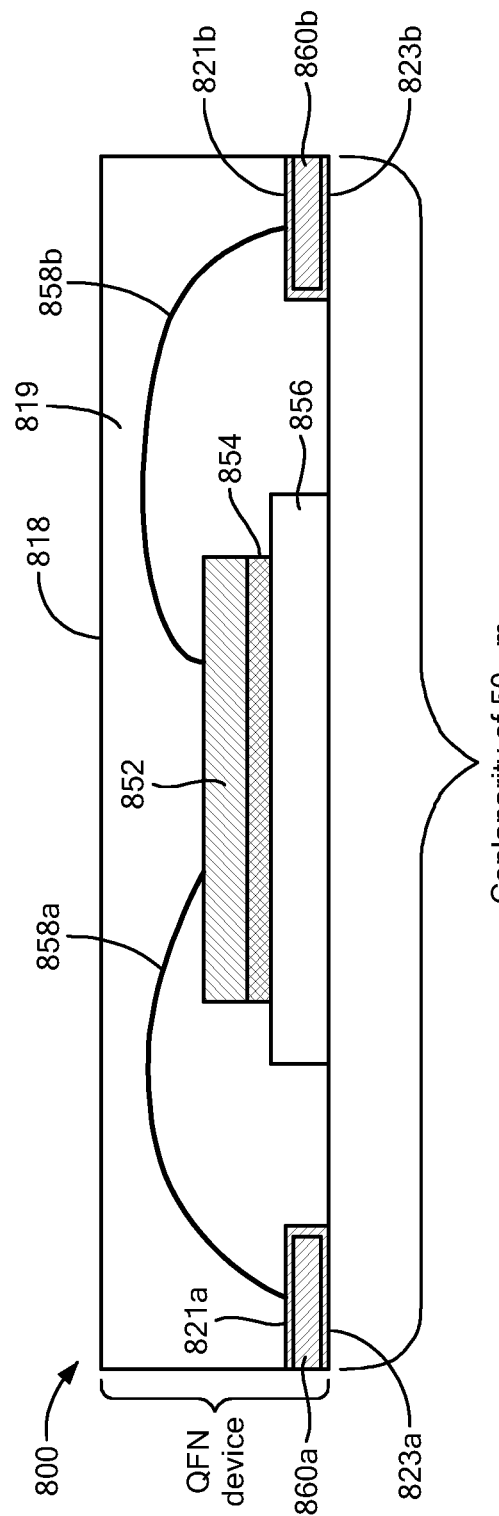
FIG. 8 is an exemplary cross-sectional view of a QFN device usable with at least some embodiments herein.

FIG. 8 is an exemplary cross-sectional view of a QFN device 818 usable with at least some embodiments herein. The cross-sectional view of FIG. 8 shows the QFN device 181 before the novel process takes place. A QFN package 718 (sometimes referred to in the art as chip scale package) comes with a die 852 that is surrounded by a lead frame 860. The die 852 that provides the primary integrated circuit functionality, as is understood. The lead frame typically is made up of a copper alloy with a matte coating of tin; for example, an exemplary lead frame can be made from a large flat sheet of copper with 0.3-0.4 mm thickness with matte tin coating (as is known, matte tin (in contrast to bright tin) is characterized by low whiskers growing, so it is advantageous for use in electronics). The die 852 is coupled to a thermal pad 856 via a layer of die attach material 854. The die 852 and the lead frame 860 are usually connected to each other using wire bonding 858, as shown in FIG. 8. Good conductors, such as aluminum and/or gold, are usually preferred for wire bonding. Some manufacturers use flip-chip technology for this interconnection because the flip-chip technique offers better electrical performance compared to some other techniques, especially for RF performance of RF devices.

In FIG. 8, the die 852 is electrically coupled to a plurality of corresponding metalized terminal pads 821*a*, 821*b* located on corresponding portions 860*a*, 860*b* on the lead frame 860, via a plurality of respective conductive bond wires 858*a*, 858*b*. The entire structure is contained within encapsulant material 819 such as a molding compound.

The top metalized terminal pads 821 to which the bonding wires 858 connect, also electrically couple to bottom metalized terminal pads 823 that are located at the bottom surface under the lead frame 860. These bottom terminal pads 821 are present along the four edges of the bottom surface of the QFN and provide electrical interconnections to the PCB to which the QFN is attached. These bottom terminal pads 821 are what need to make flushmount contact to the test board, and the process descried herein helps to optimize that.

The bottom side of the QFN package 718 also includes consists of an exposed thermal pad 856. This thermal pad 856 is configured to provide an efficient heat path to the PCB to which the QFN is to be attached. In some embodiments, the exposed thermal pad 856 enables ground connection as well. During permanent assembly of the QFN 718 into a circuit, the QFN package is soldered to the circuit board at the exposed thermal pad 856. The die attach 854 is the materiel (e.g., epoxy material or eutectic solders such as gold tin) used to fix the die to the exposed pad 856.

The exemplary QFN device of FIG. 8 is approximately 1000 microns (1000 μm) thick, but this is not limiting. Typical QFN packages can range from 1 to 2 mm thick. In an exemplary QFN device, the outer gold coating on the terminal pads 823 can have an average thickness of about 0.8 microns a coplanarity (out of flatness) of 0.05 mm (or 50 microns or ~2 mils). Thus, in embodiments with these features, there is not enough gold thickness to burnish or otherwise attempt to the bottom of the QFN device flat to achieve coplanarity needed (desired <0.5 mil or 12 microns) for flushmount contact with the test fixture of FIGS. 7A-7B, while still preserving (later) solderability.

At least some embodiments can overcome the limitation of the existing gold coating by providing a new coating of solder over the pads 823. For example, in one embodiment, the device under test (e.g., a QFN) is solder dipped (e.g., hot solder dipped) to achieve a 24.5 to 50 microns (1-2 mil) thick Pb/Sn (lead/tin) solder coating and this surface layer can be burnished on a flat stone to achieve flatness to make flush contact with test board. Solder coating will allow enough thickness to achieve coplanarity and maintaining solderability without risking burnishing to the nickel (Ni) layer below.

As is known, solder dipping (sometimes referred to as "hot solder dipping" (HSD)) is a process of immersing some or all of a component into a bath of a molten tin/lead alloy at a temperature greater than at 370° F. (188° C.). This dipping process produces a coating that comprises a very thin intermetallic layer that first forms at the interface of the base material and the tin (for example, when dipping copper or copper alloys, a copper/tin alloy is formed) followed by a layer of pure solder. In a solder dipping process, if performed correctly, no intermetallics of lead form, only those of tin and the base metal. An HSD process can have advantages over other processes such as electroplating. For example, HSD is less porous and more ductile than electroplating. HSD does not stress the component and can be more economical than electroplating. HSD can penetrate and coat many more surfaces than electroplating, such as vias and the inside walls of "through holes." HSD also can produce a coating that is more resistant to corrosion than electroplating. Care must be taken with HSD, however, to control thickness of the HSD coating and to avoid obscuring fine details of a device with a thick coating layer. However, with the ability to perform a follow up smoothing or burnishing process (as described herein), some problems with thickness and unevenness can be mitigates. Moreover, so long as the coating is conductive, adding a very small thickness to the bottom of the bottom metalized terminal pads 823, the impact on the operation of the QFN and its final assembly into a circuit, should be minimal.

HSD has been used, for example, to "finish" an exposed lead frame of packaged electronic parts, including pin grid arrays (PGA), plastic dual inline packages (PDIP), transistor outline (TO) cans, ceramic quad flatpacks (CQFP), leadless ceramic chip carriers (LCCC) and connectors. The HSD helps to ensure that the lead frame, which is usually copper or a nickel alloy (e.g., nickel alloy 42), is coated to prevent oxidation and enhance solderability in circuit card assembly. HSD also has been used as a "re-finishing" technique to replace parts with finishes that have exceeded their shelf life and to change the finish if it is incompatible with the assembly process, such as gold plated finishes with tin-lead. HSD also and is a mandated rework procedure, per J-STD-001D for parts which fail solderability testing. Solder-dipping performed for these purposes involves sufficient immersion of the device terminations to ensure that the regions at and near the solder joint are re-finished. Gold removal or HSD is a mandated procedure per the Institute of Printed Circuits (IPC) standard J-STD-001GS, which is the Space and Military Applications Electronic Hardware Addendum to IPC J-STD-001G Requirements for Soldered Electrical and Electronic Assemblies, which standard and document is hereby incorporated by reference. The IPC J-STD-007GS standard is available from the IPC at 1005 Lakeside Drive, Suite 105N, Bannockburn, Ill., 60015 and also via their website at www.ipc.org. Paragraph 4.5.1 of this standard relates to the importance of removing gold to eliminate the risk of gold embrittlement, which will degrade the quality and durability of the resultant solder joint due to the formation of brittle gold tin intermetallic. Paragraph 4.5.1 states "Except as noted in 4.5 of this Addendum, gold shall be removed from at least 95% of the surfaces to be soldered of all component leads, component terminations, and solder terminals. A double tinning process of dynamic solder save may be used for gold removal prior to mounting the component on the assembly." The exceptions in the referenced section 4.5 state that under certain conditions, printed circuit boards (PCBs) or parts are exempt from the finish removal requirements of 4.5.1. One exception is that "if there is documented evidence, available for review and approved by the User prior to use, that there are no gold related solder embrittlement issues or other metallic surface finish solder joint integrity problems, e.g., with Sn or SnBi, associated with the soldering process being used . . . [or] for electroless nickel immersion gold (ENIG), nickel-palladium gold (NiPdAu) or electroless nickel electroless palladium immersion gold (ENEPIG) finishes".

Solder dipping has not, however, been used to help improve coplanarity of devices during test, because known test fixtures have not implemented the novel test fixture structure described above (e.g., in connection with FIGS. 7A-7B. As used herein, the term "coplanarity" means the maximum distance that the physical contact points of a surface-mount device (SMD) can be from its seating plane. When placed on a flat surface, an SMD will rest on its three lowest points. This defines the seating plane of the device. The number given for coplanarity defines the maximum gap that can exist from the underside of any pin to the PCB to which it is being soldered.

Figure 9:
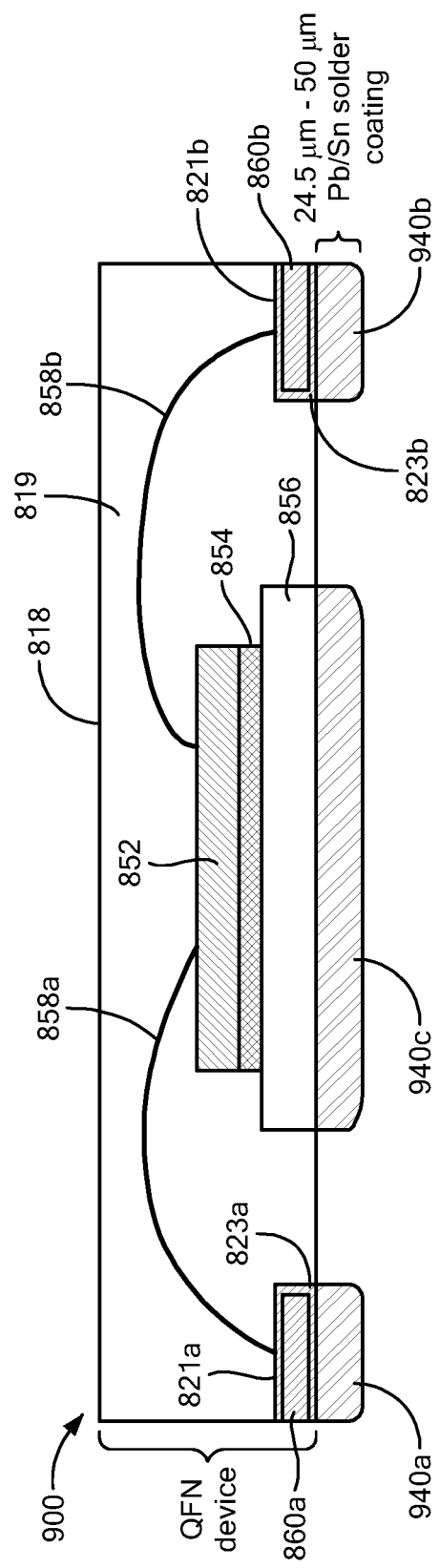
FIG. 9 is an exemplary cross-sectional view of the QFN device of FIG. 8, after an initial hot solder dip process, in accordance with one embodiment.

FIG. 9 is an exemplary cross-sectional view 900 of the QFN device of FIG. 8, after an initial hot solder dip process, in accordance with one embodiment. As FIG. 9 shows, initially after hot solder dipping, there are areas of coating 940a-940c that are located along the bottom terminal pads 823a, 823b and along the bottom thermal pad 856. As FIG. 9 shows, the coating areas 940a-940c are not necessarily coplanar and show a slight curve (this particular shape of coating is not limiting but merely illustrative). Also, it should be understood that the coating areas 940a-940c shown in FIG. 9 are not drawn to scale. In at least some embodiments, the actual thickness of the QFN device 181 is about 1000 microns, but the average thickness of the coating area 940 can range from 24.5 to 50 microns.

To help ensure that the areas of coating 940a-940c are as coplanar as possible (including within the desired coplanarity of 12 microns), a process of burnishing is performed. As used in this disclosure, burnishing at least refers to grinding a surface (e.g., with 800 grit or higher sandpaper or equivalent). Although some smearing and/or plastic deformation of the surface due to sliding contact with the burnishing surface takes place, such plastic deformation is not a primary objective in the burnishing of the solder surface. For example, in some embodiments, burnishing of a metal surface is accomplished via a process by which a burnishing product such as sandpaper is rubbed on the solder-coated surface, where this rubbing flattens "high" or other projecting irregular spots on the solder-coated surface. Those of skill in the art will appreciate that there are various ways to accomplish the rubbing/sliding contact besides sandpaper.

As is understood in the art, during burnishing, a part being burnished can be brought into contact with one or more burnishing products that provide a burnishing surface suitable to burnish and substantially planarize a surface such as a solder-coated surface. The burnishing product generally has a hardness greater than that of the workpiece it is burnishing or a "rougher" surface. Thus, as the harder or "rougher" burnishing product rubs against the surface of the softer workpiece, the stress from contact with the burnishing product causes the surface of the workpiece to smooth out, become more planar, and possibly compress slightly, to a degree to enable the product being burnished or standard to become smoother and more planar. That is, the solder-coated surface very slightly deforms or very slightly abrades under the "stress" caused by the burnishing. This is different than carving, etching, filing, or other much more abrasive techniques, which generally chip away at a surface more significantly. The goal of the burnishing in this disclosure is to create a substantially smooth and coplanar surface.

Figure 10:
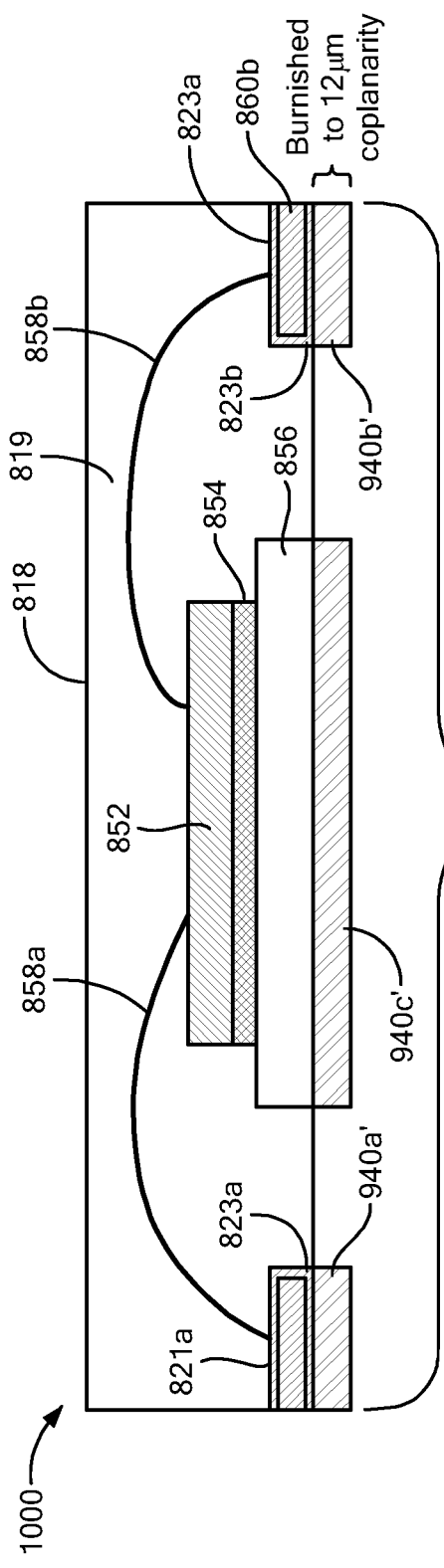
FIG. 10 is an exemplary cross-sectional view of the QFN device of FIG. 9, after a burnishing process is performed, in accordance with one embodiment.
Figure 11:
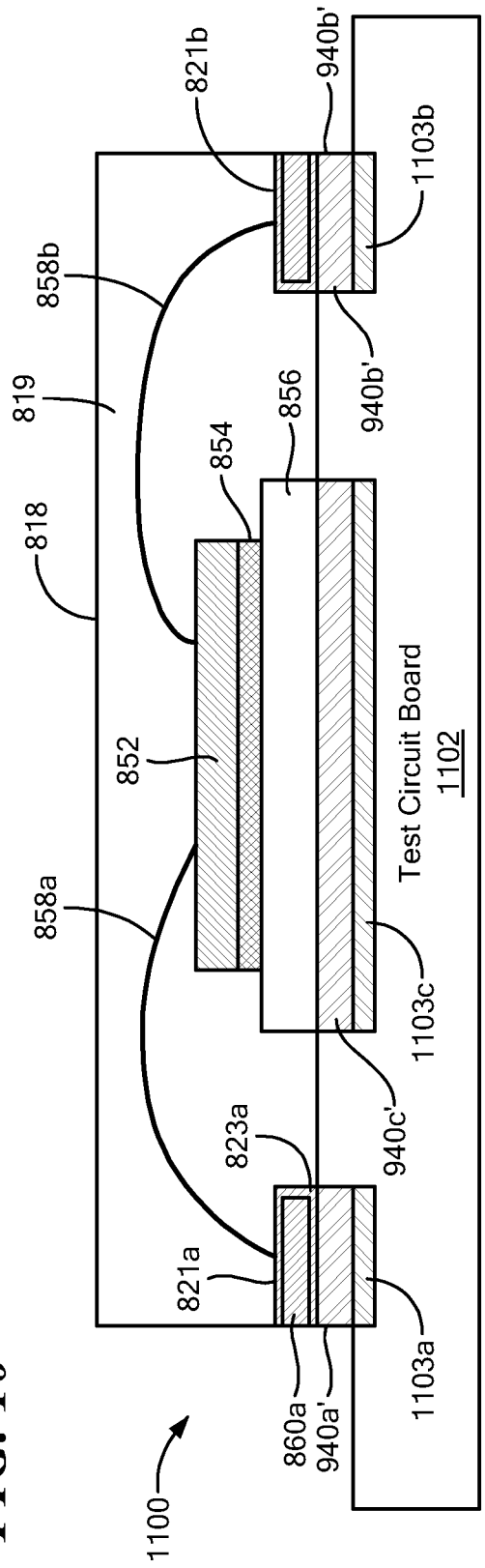
FIG. 11 is exemplary cross-sectional view of the QFN device of FIG. 10 as configured to be temporarily flush mounted to a test board, in accordance with one embodiment.

FIG. 10 is an exemplary cross-sectional view 1000 of the QFN device of FIG. 9, after a burnishing process is performed, in accordance with one embodiment. As FIG. 10 shows, after burnishing, the burnished dip areas of coating 940a'-940c', are substantially flat and coplanar to the desired degree (less than 12 microns). The remaining thickness after burnishing maintains solderability without risking any damage or burnishing of underlying electrical contacts. FIG. 11 is exemplary cross-sectional view 1100 of the QFN device of FIG. 10 as configured to be temporarily flush mounted to a test board, in accordance with one embodiment, and before assembly into a fixture, which fixtures is shown in FIG. 12, which is an exemplary cross-sectional view 1200 of the QFN device of FIG. 10, as configured within a portion of the test fixture of FIG. 7, in accordance with one embodiment.

Figure 12:
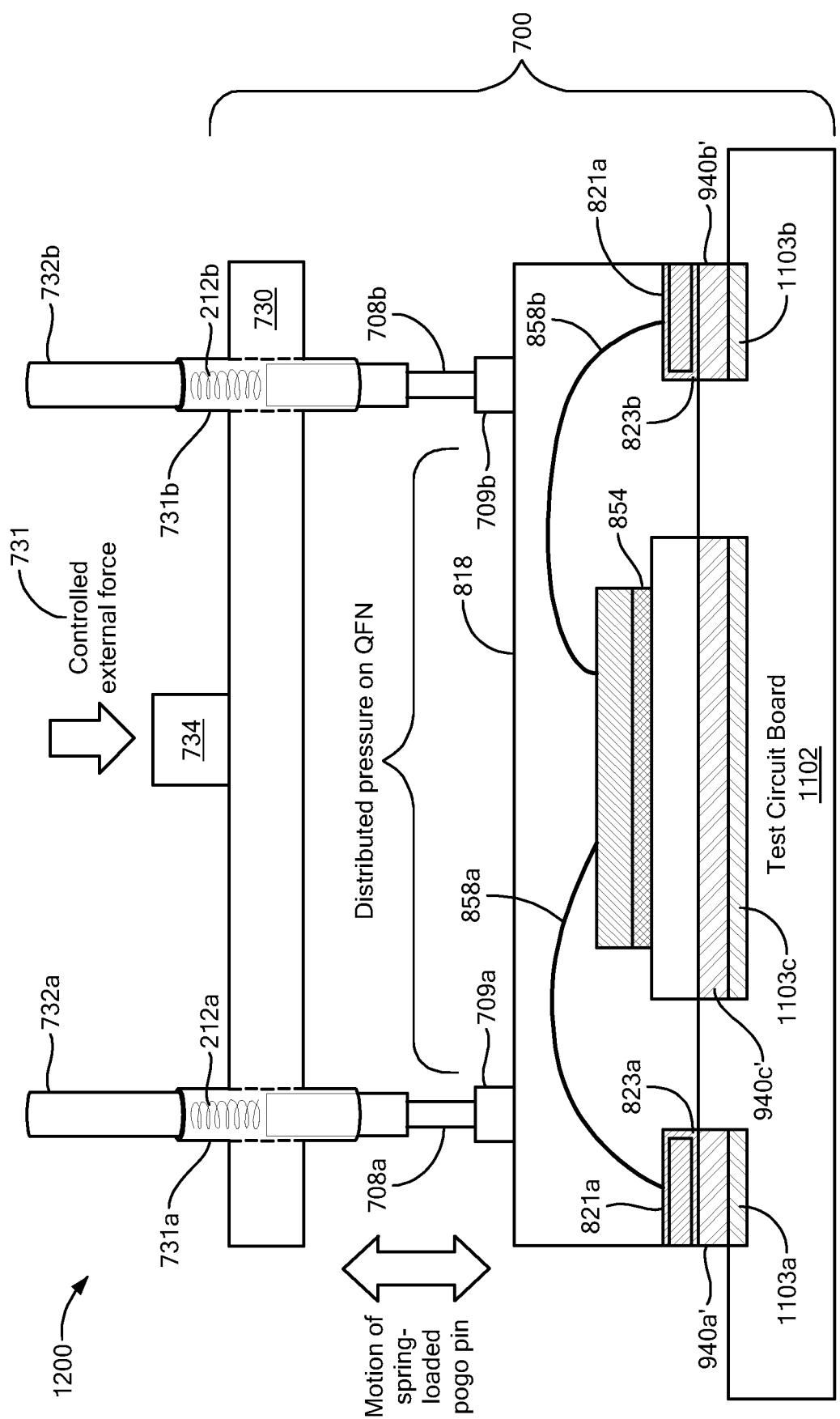
FIG. 12 is an exemplary cross-sectional view of the QFN device of FIG. 10, as configured within a portion of the test fixture of FIG. 7, in accordance with one embodiment.

Referring to FIGS. 7, 11, and 12, it can be seen that the toggle member 730 is configured to receive an upward or downward controlled external force 771, applied via an external source (e.g., control system 735 of FIG. 7) that is, in certain embodiments, attached to the test fixture 700. The controlled external force 731 presses on the toggle member 730, and the pogo pins 732a, 732b, that are coupled to the toggle member 730, have movement up and down that causes a compression (during downward motion) and an expansion (during upward motion) of the springs 212a, 212b, as will be understood. When a downward force is applied (effectively) to the tops of the pogo pins 732a, 732b, that causes a compression of the internal springs 212a, 212b, which also effectively pushes the bottom plunger portions 708a, 708b, and their respective contact tips 709a, 709b, downward, to create a set of distributed pressure points on the QFN. In certain embodiments, as discussed previously, the distributed pressure points advantageously are configured to be around the lead frame (instead of the center, which could add stress to the lid of the QFN device 818. The pressure applied at the lid of the QFN device 818 (e.g., as part of test), pushes the contact pads 823a, 823b, along with their solder dipped and burnished coating regions 940a'-940c', to make electrical contact with respective test board 1103a-1103c. The electrical contact is temporary but will be closer (in terms of electrical losses and parasitics) to contact achieved during actual solder of the QFN device 818 to a test board, as compared to electrical losses and parasitics that arise when a socketed test fixture issue.

Figure 13:
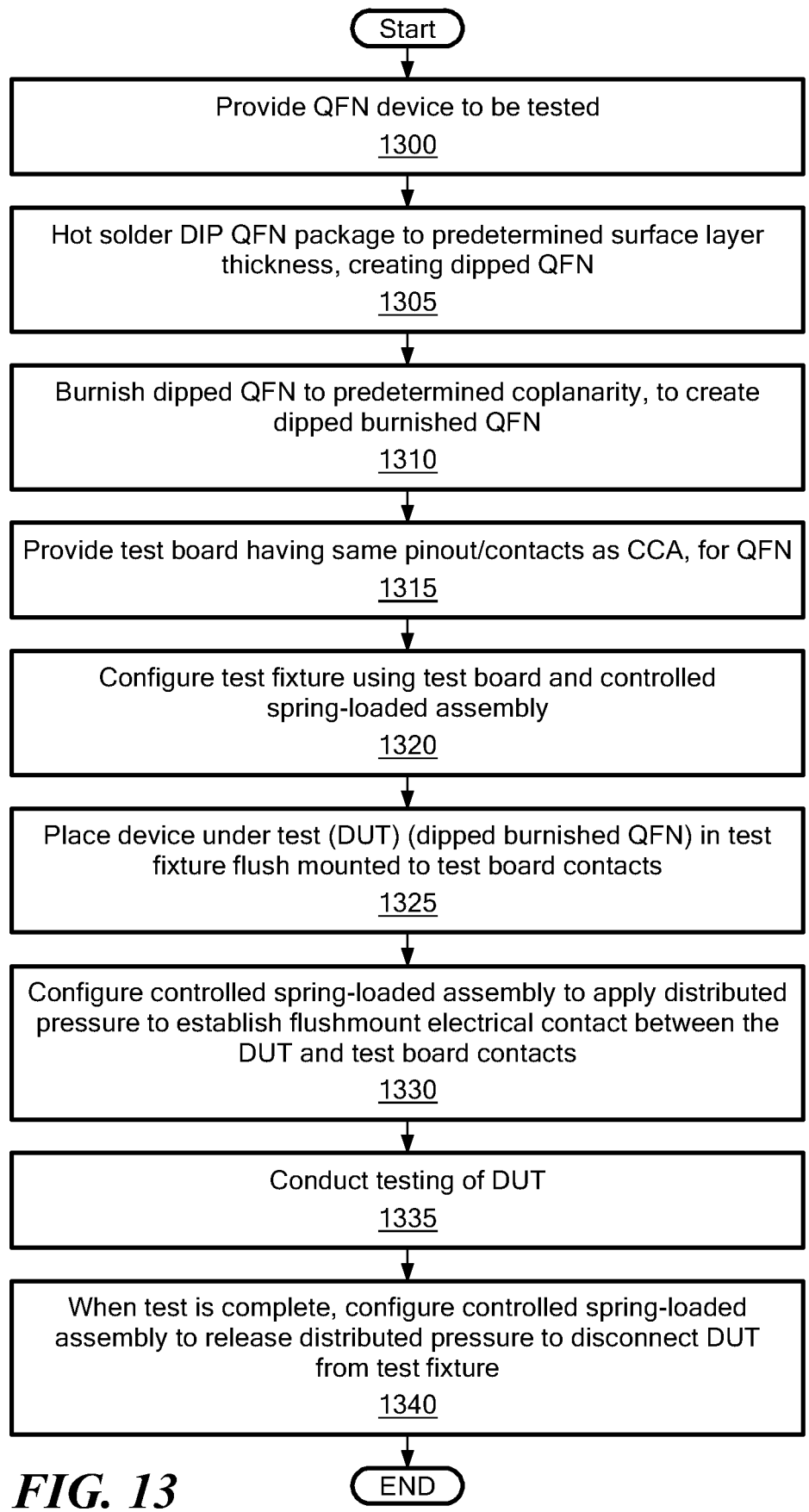
FIG. 13 is an exemplary process usable with the devices and fixtures of FIGS. 6-12 herein.

FIG. 13 is an exemplary process usable with the devices and fixtures of FIGS. 6-12 herein. Referring to FIGS. 6-12 and 13, in block 1300, a QFN device (e.g., the QFN device 818 of FIG. 8) is provided for test. The QFN device 818 is hot solder dipped to a predetermined surface layer thickness (e.g., 24.5 to 50 microns, but this is not limiting), creating a dipped QFN device (block 1305), as shown, e.g., in FIG. 9. The dipped QFN is burnished to a predetermined coplanarity (e.g., <0.5 mil or 12 microns, but this is not limiting), to create a dipped burned QFN device 818, as shown in FIG. 10 (block 1310). A test board is provided (block 1315), where the test board is configured to have the same pinout and contacts as a CCA to which the QFN is to be later assembled. The test fixture is configured to include a test board and a controlled spring loaded assembly (e.g., as shown in FIGS. 7, 11, and 12) (block 1320), and the device under test (the dipped burned QFN) is positioned in the test fixture so as to be flush mounted to the test board contacts (block 1325), as depicted in FIGS. 7, 11, and 12. The spring-loaded test fixture assembly is configured to apply a distributed pressure (block 1330) to establish a flushmount electrical contact between the DUT and the test board contacts, as depicted in FIGS. 7 and 12. Once contact is established, electrical testing of the DUT can begin (block 1335), along with other types of testing, if applicable and desired (e.g., thermal shock, temperature testing, etc.). When electrical and other testing is complete, the controlled spring loaded test fixture assembly can be controlled and configured to release the distributed pressure, to enable the DUT to be removed from the test fixture (block 1340). Once removed, the DUT is able to be later used in an actual circuit, since the testing was non-destructive and did not involve soldering to a test board. Moreover, the solder dip coating of the contact pads 823 on the device 818 will improve performance, solderability, and overall durability of the resultant solder joints, when the device 818 is ultimately soldered into a circuit, as those of skill in the art will appreciate.

It is envisioned that any or all of the embodiments described herein and/or illustrated in FIGS. 1-13 herein could be combined with and/or adapted to work with the technologies described in one or more of multiple commonly assigned U.S. Patent Applications and Patents, including but not limited to:

U.S. Pat. No. 11,033,990, entitled "Low cost approach for depositing solder and adhesives in a pattern for forming electronic assemblies"

U.S. Pat. No. 10,901,032, entitled "System and method for remote intelligent troubleshooting"

U.S. Pat. No. 8,943,662, entitled "Method for gold removal from electronic components"

U.S. Pat. No. 8,770,462, entitled "Solder paste transfer process"

U.S. Pat. No. 8,471,567, entitled "Circuit for detection of failed solder-joints on array packages"

U.S. Pat. No. 8,413,320, entitled " Method of gold removal from electronic components"

U.S. Pat. No. 8,302,948, entitled " Test fixture with high-current electrical connection"

The contents of the above-listed patents and published patent applications are hereby incorporated by reference.

The embodiments described herein advantageously are adaptable for any application that uses integrated circuit packages or electronic components or parts/packages without leads, as well as applications involving packages with any type of bottom contacts or bottom/castellated solder pads, including custom, high performance, and/or high reliability applications. The embodiments described herein also have applicability where components being used need to be well matched (e.g., impedance matched RF components) for high performance and/or to optimize performance. At least some embodiments herein have applicability for any type of manufacturing, test, or use of devices such as QFN devices, including but not limited to RF, digital, and/or power devices.

Another advantage of at least some embodiments described herein is a cost and time savings resulting from the ability to be able to reuse tested part and "cherry pick" and optimize the performance of components (e.g., in a "chain" of RF components) before components are finally soldered into a final assembly.

It should be understood, however, that the disclosed embodiments are not limited to use with the above-listed exemplary devices, systems, and arrangements. The embodiments described herein have numerous applications and are not limited to the exemplary applications described herein. It should be appreciated that such references and examples are made in an effort to promote clarity in the description of the concepts disclosed herein. Such references are not intended as, and should not be construed as, limiting the use or application of the concepts, systems, arrangements, and techniques described herein to use solely with these or any other systems.

For purposes of illustrating the present embodiments, the disclosed embodiments are described as embodied in a specific configuration and using special logical arrangements, but one skilled in the art will appreciate that the device is not limited to the specific configuration but rather only by the claims included with this specification. In addition, it is expected that during the life of a patent maturing from this application, many relevant technologies will be developed, and the scopes of the corresponding terms are intended to include all such new technologies a priori.

The terms "comprises," "comprising", "includes", "including", "having" and their conjugates at least mean "including but not limited to". As used herein, the singular form "a," "an" and "the" includes plural references unless the context clearly dictates otherwise. Various elements, which are described in the context of a single embodiment, may also be provided separately or in any suitable subcombination. It will be further understood that various changes in the details, materials, and arrangements of the parts that have been described and illustrated herein may be made by those skilled in the art without departing from the scope of the following claims.

Throughout the present disclosure, absent a clear indication to the contrary from the context, it should be understood individual elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, and/or or a data signal. Within the drawings, like or related elements have like or related alpha, numeric or alphanumeric designators (e.g., a component labeled as "204" in FIG. 2 may be similar to a component labeled "404" in FIG. 4, etc.). Further, while the disclosed embodiments have been discussed in the context of implementations using discrete components, including some components that include one or more integrated circuit chips), the functions of any component or circuit may alternatively be implemented using one or more appropriately programmed processors, depending upon the signal frequencies or data rates to be processed and/or the functions being accomplished.

Similarly, in addition, in the Figures of this application, in some instances, a plurality of system elements may be shown as illustrative of a particular system element, and a single system element or may be shown as illustrative of a plurality of particular system elements. It should be understood that showing a plurality of a particular element is not intended to imply that a system or method implemented in accordance with the invention must comprise more than one of that element, nor is it intended by illustrating a single element that the invention is limited to embodiments having only a single one of that respective elements. In addition, the total number of elements shown for a particular system element is not intended to be limiting; those skilled in the art can recognize that the number of a particular system element can, in some instances, be selected to accommodate the particular user needs.

In describing and illustrating the embodiments herein, in the text and in the figures, specific terminology (e.g., language, phrases, product brands names, etc.) may be used for the sake of clarity. These names are provided by way of example only and are not limiting. The embodiments described herein are not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, elements, circuits, modules, tables, software modules, systems, etc. Such terminology used herein, however, is for the purpose of description and not limitation.

Although the embodiments included herein have been described and pictured in an advantageous form with a certain degree of particularity, it is understood that the present disclosure has been made only by way of example, and that numerous changes in the details of construction and combination and arrangement of parts may be made without departing from the spirit and scope of the described embodiments. Having described and illustrated at least some the principles of the technology with reference to specific implementations, it will be recognized that the technology and embodiments described herein can be implemented in many other, different, forms, and in many different environments. The technology and embodiments disclosed herein can be used in combination with other technologies. In addition, all publications and references cited herein are expressly incorporated herein by reference in their entirety.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the following claims.

What is claimed is:

1. A method of testing an integrated circuit with testing apparatus, the method comprising:
    providing a test fixture comprising a toggle member configured for movement along a first axis;
    fixedly coupling a plurality of pogo pins to the toggle member in a predetermined orientation, wherein the plurality of pogo pins are configured for movement along the first axis when the toggle member is moved, wherein each respective pogo pin includes a respective plunger, from a plurality of plungers, the respective plunger configured to move within the pogo pin along the first axis;
    providing a test board in operable communication with the toggle member, the test board configured to have a first region for receiving a device under test (DUT), the test board having formed thereon, within the first region, at least one conductive region configured to substantially align with a corresponding conductor disposed on an outer surface of a device under test;
    configuring an arrangement of the plurality of pogo pins and respective plungers to make contact with a top surface of the DUT when the DUT is positioned to be aligned to and disposed on the first region of the test board; and
    configuring the testing apparatus so that movement of the toggle member along a first axis translates to at least a portion of the plurality of plungers applying a pressure sufficient to the top surface of the DUT to ensure a flushmount electrical contact between the corresponding conductor of the DUT and the conductive region of the test board;
    providing an integrated circuit (IC), the IC having a first surface with a plurality of conductors disposed thereon, wherein the first surface has a first coplanarity;
    performing a hot solder dip (HSD) process on the IC to coat the plurality of conductors with a first thickness of solder coating, to create a dipped IC;
    burnishing the first thickness of solder coating to a second coplanarity, wherein the second coplanarity is more planar than the first coplanarity, to create a dipped burnished IC; and
    configuring the dipped burnished IC as the DUT within the test fixture.

2. The method of claim 1, further comprising configuring the testing apparatus for applying an electrical signal to the conductive region of the test board when the DUT is in flushmount electrical contact with the test board, wherein the flushmount electrical contact is configured to enable the electrical signal to travel from the conductive region of the test board to the corresponding conductor of the DUT.

3. The method of claim 1, further comprising configuring the plurality of plungers to apply a distributed pressure.

4. The method of claim 1 wherein the top surface of the DUT has at least a first region that is supported underneath the top surface and a second region that is not supported under the top surface, and wherein the predetermined orientation of the pogo pins is configured to apply the pressure to the top surface of the DUT only within the first region that is supported.

5. The method of claim 1, further comprising configuring the arrangement of the pogo pins and plungers to compensate for at least a portion of variations in coplanarity in at least one of the test board and the DUT.

6. The method of claim 1 further comprising providing for each respective pogo pin a respective contact tip configured to distribute pressure and minimize damage to the top surface of the DUT when the toggle member is moved.

7. The method of claim 1, further comprising:
    disposing the DUT adjacent to the first region of the test board;
    applying a force to the toggle member sufficient to ensure that the DUT is in flushmount electrical contact with the test board; and
    applying an electrical signal to the conductive region of the test board, wherein the flushmount electrical contact is configured to enable the electrical signal to travel from the conductive region of the test board to the corresponding conductor of the DUT, wherein the electrical signal is configured to test the DUT.

* * * * *